(12) United States Patent
Guo et al.

(10) Patent No.: US 7,592,803 B1
(45) Date of Patent: Sep. 22, 2009

(54) HIGHLY SENSITIVE AMR BRIDGE FOR GEAR TOOTH SENSOR

(75) Inventors: Yimin Guo, San Jose, CA (US); Grace Gorman, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 0 days.

(21) Appl. No.: 12/214,865

(22) Filed: Jun. 23, 2008

(51) Int. Cl.
*G01B 7/30* (2006.01)
*G01R 33/05* (2006.01)
*G01R 33/09* (2006.01)

(52) U.S. Cl. .......................... 324/207.25; 324/207.21; 324/249; 324/252

(58) Field of Classification Search .......... 324/174, 324/207.21, 207.25, 252, 249; 73/514.31, 73/514.39; 360/313–316, 324–327; 365/7–8, 365/158
See application file for complete search history.

(56) References Cited

U.S. PATENT DOCUMENTS

| | | | |
|---|---|---|---|
| 6,759,843 B2 * | 7/2004 | Furlong | 324/207.2 |
| 6,956,366 B2 * | 10/2005 | Butzmann | 324/207.21 |
| 7,126,327 B1 | 10/2006 | Busch | |
| 7,141,967 B2 | 11/2006 | Butzmann | |
| 7,425,824 B2 * | 9/2008 | Busch | 324/207.25 |
| 2004/0046549 A1 | 3/2004 | Van Ostrand et al. | |
| 2004/0100251 A1 | 5/2004 | Lohberg | |
| 2005/0007105 A1 | 1/2005 | Siegle et al. | |
| 2005/0280411 A1 | 12/2005 | Bicking | |
| 2007/0096723 A1 | 5/2007 | Rieger et al. | |
| 2008/0012558 A1 | 1/2008 | Rossler et al. | |

OTHER PUBLICATIONS

Infineon application note "Dynamic Differential Hall Effect Sensor IC TLE 4923", Jul. 1, 2000, found www.datasheetcatalog.com, pp. 1-18.
Philips application note "Rotational Speed Sensors KMI15/16", AN98087, pp. 1-30.

* cited by examiner

*Primary Examiner*—Bot LeDynh
(74) *Attorney, Agent, or Firm*—Saile Ackerman LLC; Stephen B. Ackerman

(57) ABSTRACT

An AMR gear tooth rotation sensor and a method for utilizing it are disclosed. These facilitate easy manufacture of the device without sacrificing either high sensitivity or high signal output. This is achieved by forming individual sensing elements out of AMR stripes and then connecting four such sensing elements as a Wheatstone bridge. The latter is attached to a permanent magnet that provides a bias field whose value rises and falls as wheel teeth and valleys (respectively) move past the rotation sensor.

20 Claims, 5 Drawing Sheets

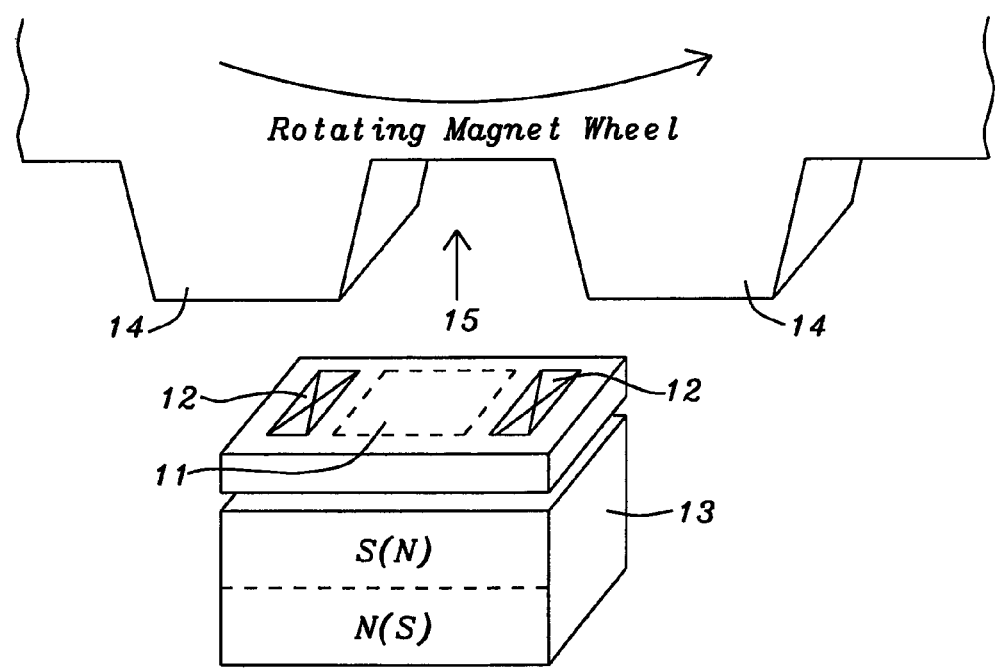
FIG. 1 - Prior Art

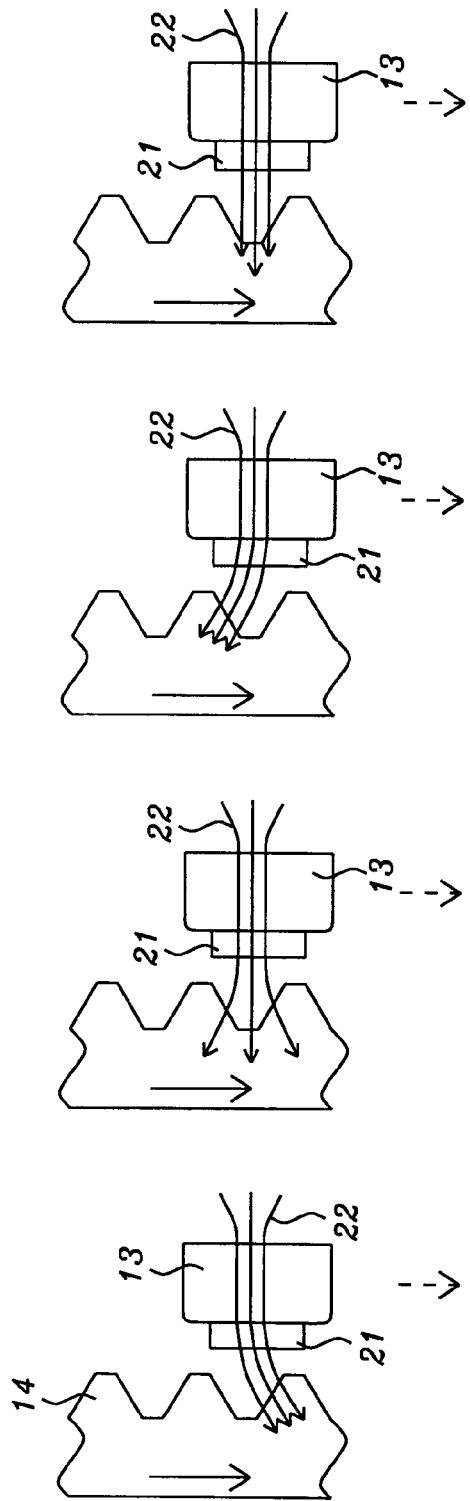
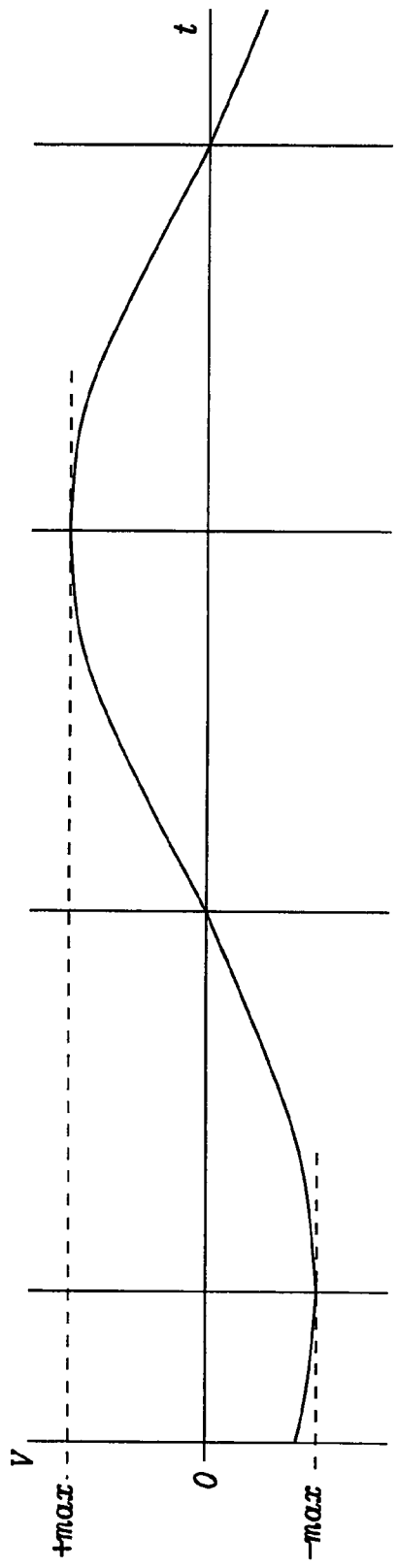
FIG. 2 – Prior Art

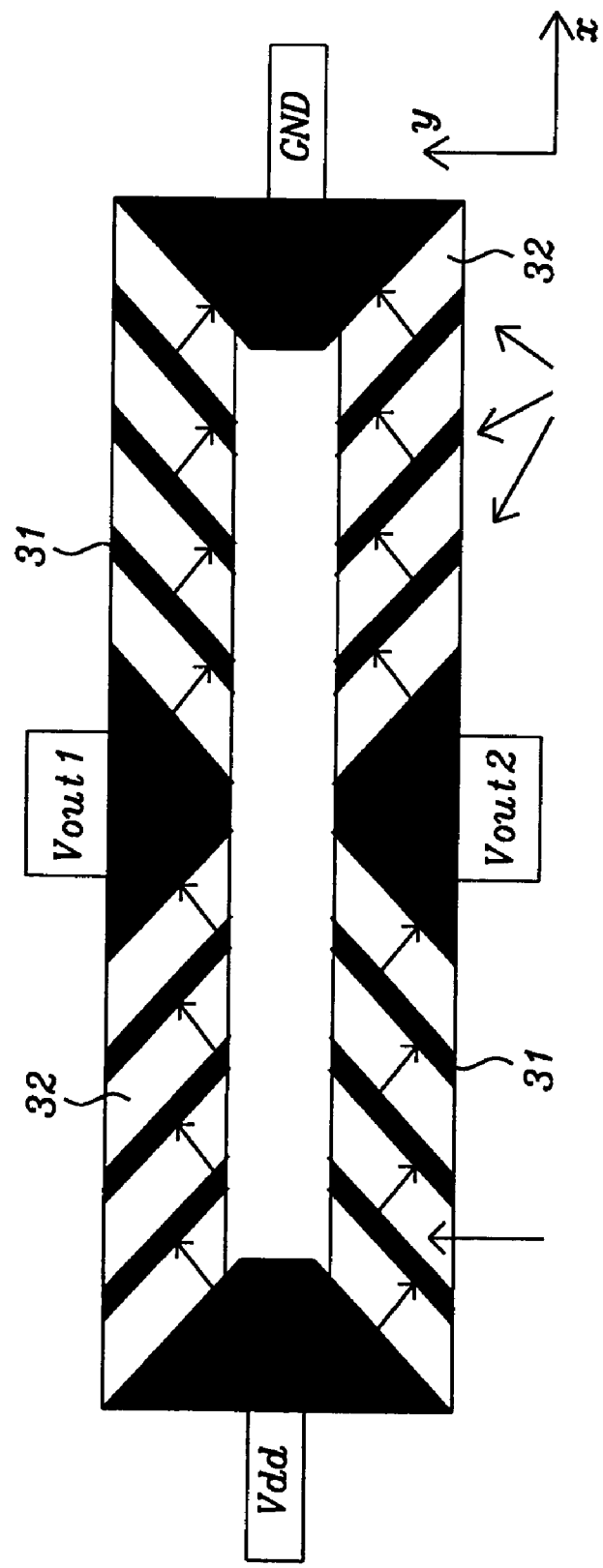
FIG. 3 – Prior Art

HIGHLY SENSITIVE AMR BRIDGE FOR GEAR TOOTH SENSOR

FIELD OF THE INVENTION

The invention relates to the general field of rotation sensors with particular reference to gear wheels and magnetic sensors based on anisotropic magneto-resistance.

BACKGROUND OF THE INVENTION

Conventional gear tooth sensors [1] consist of a Hall effect sensor, and integrated circuit (IC) and a hard magnet, as shown in FIG. 1. The Hall IC supports two Hall sensors 12, which sense the magnetic profile of the ferromagnetic target simultaneously, but at different points, generating a differential internal analog voltage that is further processed for precise switching of the digital output signal. To achieve a high differential signal output, the two Hall probes (or sensors) are spaced so that one Hall sensor faces a field concentrating tooth and the other Hall sensor faces a gap between teeth.

Permanent magnet 13 is mounted, with either pole being to the rear of IC 11, to provide a constant magnetic bias field. When one Hall sensor momentarily faces tooth 14 while the other faces gap 15 between teeth, the gear tooth acts as a flux concentrator. It increases the flux density through the Hall probe and a differential signal is produced. As the toothed wheel turns, the differential signal changes its polarity, following the change from tooth to gap. An integrated high-pass filter regulates the differential signal to zero by means of a time constant that can be set with an external capacitor. In this way only those differences are evaluated that changed at a minimum rate. The output signal is not defined in the steady state.

An anisotropic magneto-resistance (AMR) based sensing structure has also been used as a gear tooth sensor, in which the sensing structure is similar to traditional Hall IC based gear tooth sensor except that two Hall probes are replaced by single AMR bridge 21[2], as shown in FIG. 2. Due to the high sensitivity of AMR materials, the AMR based gear tooth sensors provide extremely large output signal from AMR elements, which is stable over the rated temperature and voltage range. As a result, the AMR based gear tooth sensors feature excellent (large) air-gap performance and an extremely stable operating envelops as well as the robust reliability characteristics.

As shown in FIG. 2, the magnetic field generated by the bias magnet is influenced by the moving ferromagnetic gear tooth so AMR sensing bridge 21 detects the variation of the magnetic field component 22 within the AMR film plane. The signal output is then generated from differential signal the AMR bridge.

In this design, the "barber pole" AMR structure, shown in FIG. 3, is used to achieve linearization of the signal output, while a stabilization field is provided by a magnetic field component in the y-direction (normal to the direction of motion of the gear tooth wheel) of the permanent magnet to prevent possible AMR magnetization flipping due to external stray field. This y-component is achieved by tilting the permanent magnet away from its original perfectly perpendicular direction. As the gear toothed wheel turns, the AMR sensing element also experiences a changing magnetic field along the x-direction, so Vout-1-Vout-2, the differential voltage from this bridge, changes its polarity at the same rate as going from tooth to gap, as seen earlier in FIG. 2. Note that, in FIG. 3, the "barber pole" structure shown there comprises diagonal stripes 32 of permalloy separated by non-magnetic, but electrically conductive, metallic stripes.

Another design, proposed by K. Van Ostrand, et al. [3], uses a saturated magnetization approach. In this method, a permanent magnet is designed with a gap where the AMR bridge is located, so that the large field produced by the permanent magnet is sufficient to force the magnetizations in the AMR bridge circuit into a saturated mode in which AMR resistance no longer responds to a change in magnetic field strength; instead, it responds only to changes in magnetic field direction when a ferromagnetic gear tooth target moves past a face of the magnet. In this approach, the permanent magnet design is both complicated and expensive.

REFERENCES

1. Infineon application note "Dynamic Differential Hall Effect Sensor IC TLE 4923"
2. Philips application note "Rotational Speed Sensors KMI15/16"
3. US patent application, US 2004/0046549 A1

Following a routine search of the prior art, the following references of interest were found:

In U.S. Patent Application 2004/0100251, Lohberg shows four AMR elements consisting of stripes, but not at a 45 degree angle. U.S. Patent Application 2004/0046549 (Van Ostrand et al) discloses an AMR device that senses change in magnetic direction using a complicated design. U.S. Pat. No. 7,141,967 (Butzmann) shows four AMR elements that comprise a sensor that measures speed of a toothed gear.

In U.S. Patent Application 2005/0007105, Siegle et al. disclose inferring speed by following the change in resistance of individual sensors. U.S. Patent Application 2007/0096723 (Reiger et al) shows four AMR sensors arranged in a diamond pattern. U.S. Pat. No. 7,126,327 (Busch) discloses a gear tooth position and speed sensor, U.S. Patent Application 2005/0280411 (Bicking) shows four AMR proximity sensors measuring resistance change, and U.S. Patent Application 2008/0012558 (Rossler et al.) describes MR sensors connected by a switch in a Wheatstone Bridge.

SUMMARY OF THE INVENTION

It has been an object of at least one embodiment of the present invention to provide an apparatus for measuring the rotation rate of a wheel having ferromagnetic teeth.

Another object of at least one embodiment of the present invention has been to provide a method for fabricating and then utilizing said apparatus.

Still another object of at least one embodiment of the present invention has been to utilize the AMR effect for the realization of the invention.

A further object of at least one embodiment of the present invention has been that all parts of the sensor portion of the apparatus be formed through deposition on a single substrate.

These objects have been achieved by first forming an AMR sensing element from multiple stripes of deposited AMR material which are positioned and aligned to lie side by side and tip to tip. These stripes are placed very close together so that their shape anisotropy is determined by their collective overall shape rather than by the shapes of the individual stripes. A further decrease in the shape anisotropy is achieved by placing an additional 'dummy' stripe alongside each of the outermost stripes of the sensing element.

The AMR stripes that make up the sensing element (excluding the 'dummy' stripes) are connected in series whereby the sensing element functions as a single resistor. Four of these sensing elements are then series connected in a closed loop to become an AMR Wheatstone bridge which acts as a magnetic sensor.

This magnetic sensor is then attached to the underside of a permanent magnet whose purpose is to provide a biasing field whose value (at the sensor) depends on whether the sensor is opposite a tooth (maximum field) or a valley between teeth (minimum field). The rotation detector is positioned to overlie the wheel's rim, with the magnetic sensor being symmetrically above the wheel but the permanent magnet is laterally displaced relative to the rim's center line to ensure the presence, in the Y direction, of the biasing field.

BRIEF DESCRIPTION OF THE DRAWINGS

FIG. 1. Prior art with a Hall effect IC based gear tooth sensor.

FIG. 2. Signal from a prior art AMR based gear tooth sensor.

FIG. 3. Barber pole AMR structure use in the gear tooth sensor of the first prior. Arrows represent current flowing direction.

DESCRIPTION OF THE PREFERRED EMBODIMENTS

Figure 4:
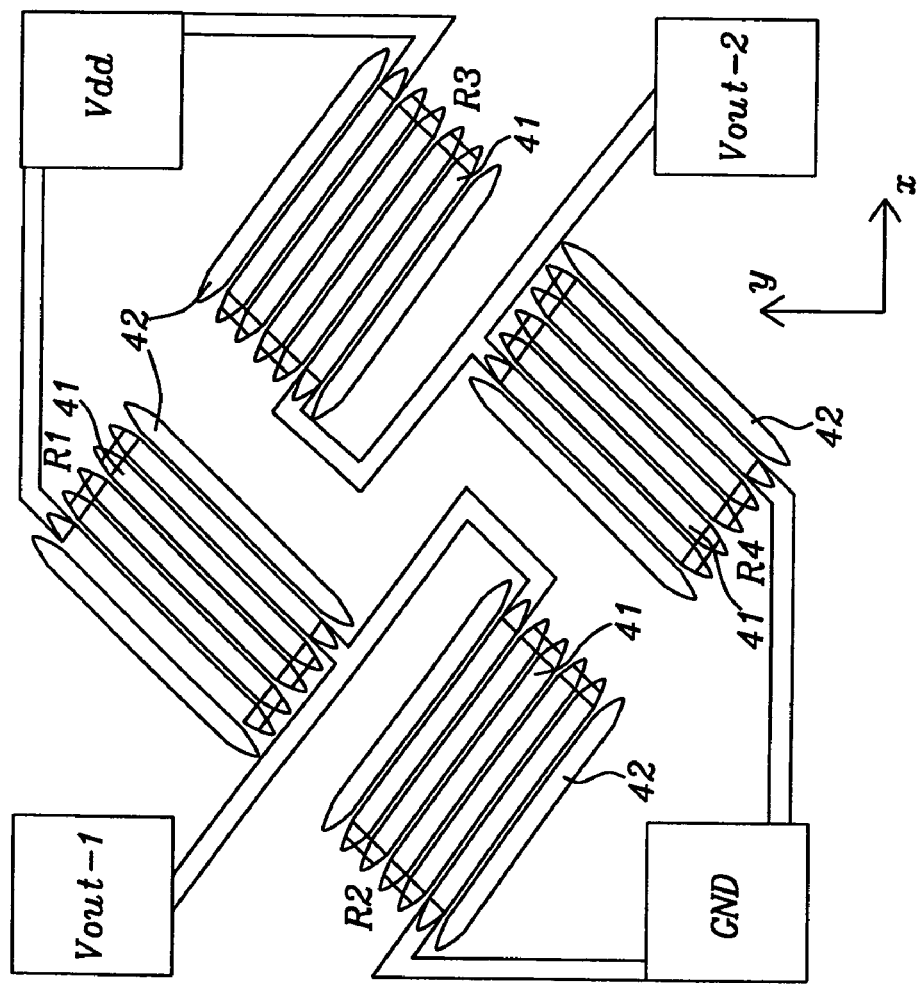
FIG. 4 shows the structure of the AMR bridge used by the present invention FIG. 5. Shows how the AMR sensor assembly is positioned relative to the rotating gear toothed wheel for speed measurements.

In the sensor of the present invention, four AMR sensing elements are arranged to form one Wheatstone bridge. These four AMR sensing elements have identical geometries and each is oriented to be at an angle of 45 degrees relative to its immediate neighbors, as shown in FIG. 4. Each AMR sensing element comprises several parallel AMR stripes. Each AMR stripe has been given the same width, which ranges from 5 to 50 microns. The gap (separation) between adjacent stripes is much smaller than each stripe's width, preferably less than 0.5 micron although a separation up to about 2 microns can be tolerated, if need be. Within each sensing element the AMR stripes are series connected through high conductance layers, thereby forming one of the four resistors of the Wheatstone bridge.

An additional AMR stripe is placed alongside the outermost sensing stripe of each resistor, also with a very small separation (or gap) that is preferably less than 0.5 micron, but which is not electrically connected to any part of the AMR bridge. These additional AMR stripes serve as dummy soft magnetic stripes to both reduce the shape anisotropy as well as to eliminate magnetic domain hysteresis in the sensing stripes.

Figure 5:
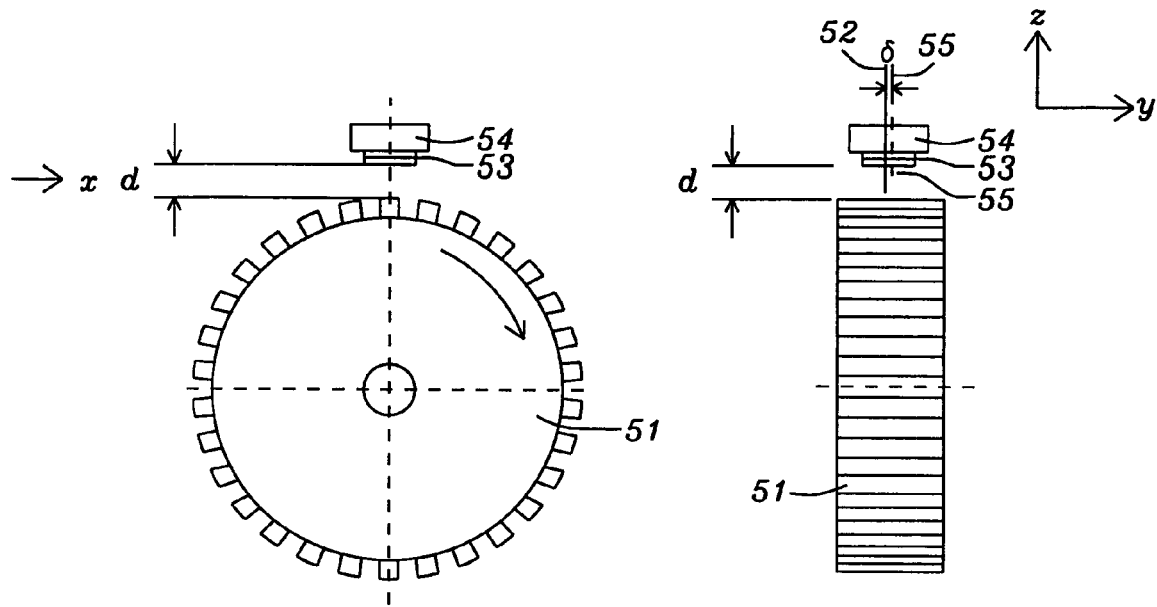

As shown in FIG. 5, the magnetic field, generated by a permanent magnet directly onto the AMR sensor depends upon magnet strength, geometry, and position relative to the nearest tooth or valley of the gear. A permanent magnet 54, or multiple permanent magnets, mounted with either pole contacting the rear side of AMR sensor 53 produces a constant magnetic field. Most of this magnetic field is concentrated in the z-component which is normal to the MR film plane. In other words, the field is outside the film plane and therefore the magnetization would not respond to it.

Figure 6:
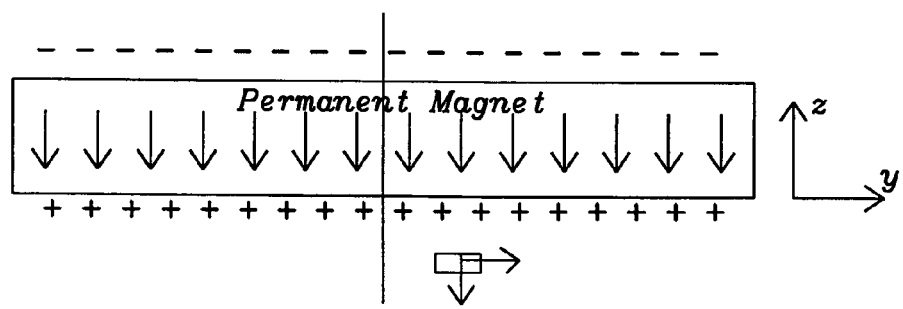
FIG. 6. Here, thicker arrows represent magnetizations in the magnet while the thinner arrows show these fields at the AMR sensor. + represents positive magnetic charge while − represents negative magnetic charge.

Due to the offset of magnet 54's center line 52 from center line 55 of wheel rim 51 by an amount δ, the magnet's field also has a y-component which serves as a biasing field to stabilize the AMR sensor, as shown in FIG. 6. When used for gear tooth wheel speed detection, sensor assembly 53 is brought close to the gear wheel edge where the high permeability of the ferromagnetic tooth can cause the permanent magnet's field to bend towards the gear wheel as each ferromagnetic tooth approaches the AMR sensor. This brings about a varying x-component of the field at the AMR sensor. As a result, the AMR sensor generates a signal output that corresponds to this varying x-component field.

In the sensor of the invention a single AMR Wheatstone bridge is used to measure the magnetic field. As noted above, this AMR Wheatstone bridge consists of four identical AMR elements, R1, R2, R3 and R4, as shown in FIG. 4. To fabricate these four sensing elements, a full AMR film is first deposited. Then photolithography is used to pattern the AMR film into rectangular shapes, examples of which carry the label 41. These all have the same large aspect ratio but with different orientations: R1 and R4 have the same long axis—45 degree away from the magnetic biasing field direction, while R2 and R3 have the same long axis which is −45 degree away from the magnetic biasing field direction.

R1 and R2 are series connected to become one branch of the Wheatstone bridge, while R3 and R4 are series connected to become the other branch of the Wheatstone bridge. Since the biasing field is normal to the direction of motion of the toothed wheel the long axes of R1, R2, R3 and R4 are all oriented to be at either +45 or −45 degrees relative to the direction of motion of the gear toothed wheel.

A constant voltage Vdd (=positive voltage) is applied across both branches (R1, R2) and (R3, R4) while output voltage V1 is taken at the mid point of the first branch (R1, R2) and output voltage V2 is taken from the mid point of the second branch (R3, R4). Proper use of the sensor requires that the biasing field be much larger than the anisotropy field of each AMR element and that their magnetizations be set to be close to the biasing field direction. The required low anisotropy field is achieved, already described above, by the placement of dummy AMR stripes (such as 42) close to the outermost sensing AMT stripes (such as 41), separated therefrom by a very small gap, thereby ensuring that the net anisotropy field is relatively low.

As the gear wheel rotates, a gear field is produced at the AMR bridge in the same direction as the moving wheel but alternating in magnitude. The free magnetizations (FM) in AMR elements R1, R2, R3 and R4 rotate away from their biased direction when responding to the gear field. When the gear field is along the +x direction, free magnetizations in AMR elements R2 and R3 rotate to reduce their resistances while AMR elements R1 and R4 rotate to increase their resistances, yielding a negative (Vout-1-Vout-2) signal. When the gear field is along the −x direction, the free magnetizations in AMR elements R2 and R3 rotate to increase their resistances while AMR elements R1 and R4 rotate to reduce their resistances, yielding a positive (Vout-1-Vout-2) signal. Thus (Vout-1-Vout-2) is generated as a function of the gear field. This signal is then amplified and processed in a circuit that computes the rotational speed of the gear wheel, including if the wheel is stationary.

What is claimed is:

1. A method to determine rotational speed of a toothed wheel having ferromagnetic teeth and a rim with a center line, comprising:

forming, on a substrate, multiple stripes of anisotropic magneto-resistance (AMR) material, each AMR stripe having a width, a length, and an aspect ratio of at least 5;

positioning and aligning a number of said AMR stripes to lie side by side and tip to tip, separated one from another by a separation distance that is at least 5 times smaller than said AMR stripe width, thereby forming an AMR sensing element that has a long axis, parallel opposing long sides, and an outermost AMR stripe at each long side;

series connecting said AMR stripes thereby enabling said sensing element to function as a single resistor;

positioning and aligning an additional AMR stripe alongside each of said outermost AMR stripes, said additional stripes being electrically isolated from said AMR sensing element and separated therefrom by a distance of no more than 2 microns;

series connecting four of said AMR sensing elements in a closed loop as an AMR Wheatstone bridge having a first node at which two adjacent AMR sensing elements are connected and a second node at which two remaining AMR sensing elements are connected, thereby forming a magnetic sensor;

providing an assemblage of one or more permanent magnets and attaching said magnetic sensor thereto, thereby forming a rotation detector;

with said magnetic sensor closest to said rim, positioning said rotation detector to overlie said rim at a first distance therefrom and adjusting said magnetic sensor and said assemblage so that said magnetic sensor symmetrically overlies a center line of said rim and said assemblage is laterally displaced relative to said center line by a second distance whereby said assemblage provides a magnetic field whose y-component serves as a biasing field;

then applying a fixed voltage between said first and second nodes of said AMR Wheatstone bridge whereby first and second output voltages are generated at nodes adjacent to said first and second nodes; and then determining a difference between said first and second output voltages and computing therefrom said rotational speed of said toothed wheel, including zero rotational speed.

2. The method of claim 1 wherein said AMR material is selected from the group consisting of permalloy, binary alloys of Ni, Fe, Co, and B, and ternary alloys of Ni, Fe, Co, and B.

3. The method of claim 1 wherein said stripe width is in a range of 10 to 30 microns.

4. The method of claim 1 wherein said stripe width is in a range of 5 to 500 microns.

5. The method of claim 1 wherein said stripe length is in a range of 50 to 250 microns.

6. The method of claim 1 wherein said stripe length is in a range of 25 to 500 microns.

7. The method of claim 1 wherein said number of AMR stripes in each AMR sensing element is in a range of 5 to 20.

8. The method of claim 1 wherein said number of AMR stripes in each AMR sensing element is in a range of 1 to 100.

9. The method of claim 1 wherein said first distance of said rotation detector from said rim is in a range of from 0.5 to 6 mm.

10. The method of claim 1 wherein said second distance that said assemblage is laterally displaced relative to said center line is in a range of from 0.5 to 6 mm.

11. An apparatus to determine rotational speed of a toothed wheel having ferromagnetic teeth and a rim with a center line, comprising:

on a substrate, multiple stripes of anisotropic magneto-resistance (AMR) material, each AMR stripe having a width, a length, and an aspect ratio of at least 5;

said AMR stripes lying side by side and tip to tip, separated one from another by a separation distance that is at least 5 times smaller than said AMR stripe width, thereby defining an AMR sensing element that has a long axis, parallel opposing long sides, and an outermost AMR stripe at each long side;

said AMR stripes being serially connected as a single resistor;

an additional AMR stripe alongside each of said outermost AMR stripes, said additional stripes being electrically isolated from said AMR sensing element and separated therefrom by a distance of no more than 2 microns;

four of said AMR sensing elements being serially connected in a closed loop as an AMR Wheatstone bridge having a first node at which two adjacent AMR sensing elements are connected and a second node at which two remaining AMR sensing elements are connected, thereby forming a magnetic sensor;

a rotation detector comprising an assemblage of one or more permanent magnets attached to said magnetic sensor; and said rotation detector being oriented so that said magnetic sensor overlies said rim at a first distance therefrom and is closer to said rim than said assemblage; and wherein said magnetic sensor symmetrically overlies a center line of said rim and said assemblage is laterally displaced relative to said center line by a second distance, whereby said assemblage provides a magnetic field whose y-component serves as a biasing field.

12. The apparatus described in claim 11 wherein said AMR material is selected from the group consisting of permalloy, binary alloys of Ni, Fe, Co, and B, and ternary alloys of Ni, Fe, Co, and B.

13. The apparatus described in claim 11 wherein said stripe width is in a range of 10 to 30 microns.

14. The apparatus described in claim 11 wherein said stripe width is in a range of 5 to 500 microns.

15. The apparatus described in claim 11 wherein said stripe length is in a range of 50 to 250 microns.

16. The apparatus described in claim 11 wherein said stripe length is in a range of 25 to 500 microns.

17. The apparatus described in claim 11 wherein said number of AMR stripes in each AMR sensing element is in a range of 5 to 20.

18. The apparatus described in claim 11 wherein said number of AMR stripes in each AMR sensing element is in a range of 1 to 100.

19. The apparatus described in claim 11 wherein said first distance of said rotation detector from said rim is in a range of from 0.5 to 6 mm.

20. The apparatus described in claim 11 wherein said second distance that said assemblage is laterally displaced relative to said center line is in a range of from 0.5 to 6 mm.

* * * * *